United States Patent
Kim et al.

(10) Patent No.: US 10,509,067 B2
(45) Date of Patent: Dec. 17, 2019

(54) METHOD FOR AC ARC FAULT DETECTION USING MULTIDIMENSIONAL ENERGY POINTS

(71) Applicants: Mersen USA Newburyport-MA, LLC, Newburyport, MA (US); Northeastern University, Boston, MA (US)

(72) Inventors: Jonathan C. Kim, Bayside, NY (US); Bradley M. Lehman, Belmont, MA (US); Dorin Octavian Neacsu, Westford, MA (US); Roy Ball, Coral Springs, FL (US)

(73) Assignees: Mersen USA Newburyport-MA, LLC, Newburyport, MA (US); Northeastern University, Boston, MA (US)

( * ) Notice: Subject to any disclaimer, the term of this patent is extended or adjusted under 35 U.S.C. 154(b) by 287 days.

(21) Appl. No.: 15/642,409

(22) Filed: Jul. 6, 2017

(65) Prior Publication Data
US 2019/0011489 A1    Jan. 10, 2019

(51) Int. Cl.
*G01R 31/02*    (2006.01)
*H02H 1/00*    (2006.01)

(52) U.S. Cl.
CPC .......... *G01R 31/02* (2013.01); *G01R 31/025* (2013.01); *H02H 1/0015* (2013.01)

(58) Field of Classification Search
CPC ..... G01R 31/02; G01R 31/025; H02H 1/0015
See application file for complete search history.

(56) References Cited

U.S. PATENT DOCUMENTS

| | | | |
|---|---|---|---|
| 5,485,093 A | 1/1996 | Russell et al. | |
| 5,729,145 A | 3/1998 | Blades | 324/536 |
| 6,625,550 B1 | 9/2003 | Scott et al. | 702/58 |
| 6,650,516 B2 | 11/2003 | Langford et al. | 361/42 |
| 7,219,023 B2 | 5/2007 | Banke et al. | 702/58 |
| 7,391,218 B2 | 6/2008 | Kojori et al. | 324/520 |
| 7,400,481 B2 | 7/2008 | Pellon et al. | 361/93.1 |
| 7,460,346 B2 | 12/2008 | Deshpande et al. | 361/62 |
| 7,750,645 B2 | 7/2010 | Pipitone et al. | 324/536 |
| 7,796,366 B2 | 9/2010 | Kilroy et al. | 361/42 |
| 8,093,904 B2 | 1/2012 | Ohta et al. | 324/536 |
| 9,329,220 B2 | 5/2016 | Balog | G01R 31/02 |
| 2005/0254187 A1 | 11/2005 | Chu | 361/42 |

(Continued)

FOREIGN PATENT DOCUMENTS

| | | | |
|---|---|---|---|
| CN | 104360205 A | 2/2015 | G01R 31/00 |
| CN | 104764963 A | 7/2015 | G01R 31/00 |

(Continued)

OTHER PUBLICATIONS

Restrepo, "Arc Fault Detection and Discrimination Methods," 2007 Proceedings of the 53rd IEEE Holm Conference on Electrical Contacts, Sep. 16-19, 2007.

*Primary Examiner* — Minh Q Phan
(74) *Attorney, Agent, or Firm* — Kusner & Jaffe

(57) ABSTRACT

A method for detecting an arc fault in AC circuits. The method includes monitoring disturbances in an AC voltage signal by analyzing multi-dimensional energy points. A voltage signal is captured and the zero-crossing, minimum peak, and maximum peak are identified. Arcing signatures between the maximum and minimum peaks of the captured AC voltage signal are analyzed to detect an arc fault.

7 Claims, 13 Drawing Sheets

(56) References Cited

U.S. PATENT DOCUMENTS

| | | | |
|---|---|---|---|
| 2007/0247767 A1* | 10/2007 | Zhang | H02H 1/0015 361/42 |
| 2012/0075755 A1 | 3/2012 | Kim et al. | 361/42 |
| 2013/0015875 A1 | 1/2013 | Kumar | 324/761.01 |
| 2015/0357972 A1 | 12/2015 | Lespinats et al. | |
| 2016/0187410 A1 | 6/2016 | Kolker et al. | G01R 31/025 |
| 2016/0370420 A1 | 12/2016 | Langley et al. | G01R 31/1272 |

FOREIGN PATENT DOCUMENTS

| | | | |
|---|---|---|---|
| WO | WO 96/35250 | 11/1996 | H02H 1/00 |
| WO | WO 2011/011711 A2 | 1/2011 | |

\* cited by examiner

METHOD FOR AC ARC FAULT DETECTION USING MULTIDIMENSIONAL ENERGY POINTS

FIELD OF THE INVENTION

The present invention relates generally to the detection of electrical arc faults, and more particularly to a method of AC arc fault detection that uses multidimensional energy points.

BACKGROUND OF THE INVENTION

This invention relates to identification of electrical arc faults and, more particularly, to a method for identifying the occurrence of AC arc events.

An arc fault is a high power discharge of electricity between two or more conductors. This discharge translates into heat, which can break down the wire insulation and possibly trigger an electrical fire. Common causes of arc faults include faulty connections due to corrosion, and degradation of electrical wiring, equipment, and related interconnections due to temperature, humidity, vibration, or other environmental conditions. In some cases degradation is simply due to aging of components over a period of time.

In view of the serious safety hazards associated with an arc fault, it is important to have the ability to quickly, reliably, and accurately detect the presence of an arc fault condition.

Prior art methods for detecting AC arc faults have relied upon an analysis of disturbances in the "current" signal. In contrast, the present invention provides an improved method of AC arc fault detection that relies upon an analysis of the "voltage" signal to detect an arc fault.

SUMMARY OF THE INVENTION

In accordance with the present invention, there is provided a method for detecting arc faults in an AC circuit, comprising: (a) measuring an AC voltage signal to obtain one cycle of the AC voltage signal; (b) obtaining a left-hand energy summation value and a right-hand energy summation value from the measured AC voltage signal, wherein the left-hand energy summation value is determined by summing left-hand energy values left of a zero-crossing and the right-hand energy summation value is determined by summing right-hand energy values right of the zero-crossing; (c) obtaining a differential left-hand energy summation value and a differential right-hand energy summation value, wherein the differential left-hand energy summation value and differential right-hand energy summation value respectively indicate changes in the left-hand energy summation value and the right-hand energy summation value; (d) obtaining a total energy summation value, wherein the total energy summation value is a sum of the left-hand energy summation value and the right-hand energy summation value; (e) determining whether both the differential left-hand energy summation value and the differential right-hand energy summation value are simultaneously inside their respective transient arc boundaries, wherein if both the differential left-hand energy summation value and the differential right-hand energy summation value are simultaneously inside their respective transient arc boundaries, then setting a potential arc flag; (f) determining whether both the left-hand energy summation value and the right-hand energy summation value are simultaneously inside stable arc boundaries, wherein if both the left-hand energy summation value and the right-hand energy summation value are simultaneously inside the stable arc boundaries, then setting a potential arc flag; (g) detecting an arc fault if a predetermined number of consecutive potential arc flags are set; and (h) repeating steps (a) through (g) a plurality of times to monitor for arc faults.

An advantage of the present invention is the provision of an AC arc fault detection method that relies upon an analysis of a voltage signal to detect an arc fault.

Another advantage of the present invention is the provision of an AC arc fault detection method that is fast, reliable, and accurate.

A still further advantage of the present invention is the provision of an AC arc fault detection method that reduces the time need to detect an AC arc fault.

These and other advantages will become apparent from the following description of illustrated embodiments taken together with the accompanying drawings and the appended claims.

BRIEF DESCRIPTION OF THE DRAWINGS

The invention may take physical form in certain parts and arrangement of parts, an embodiment of which will be described in detail in the specification and illustrated in the accompanying drawings which form a part hereof, and wherein.

DETAILED DESCRIPTION OF THE INVENTION

Figure 1:
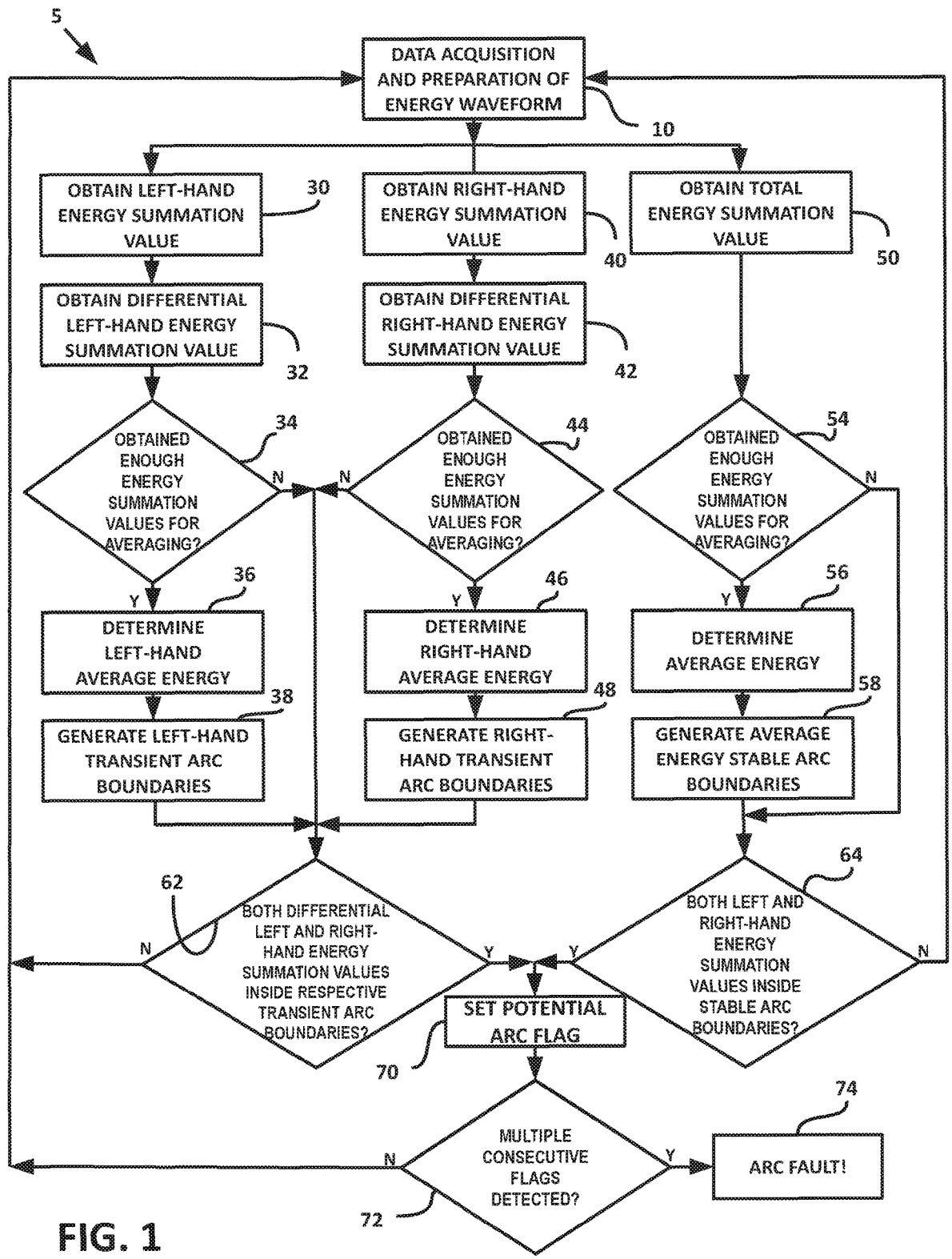
FIG. 1 is a flow chart of an arc fault detection algorithm according to an embodiment of the present invention.
Figure 2:
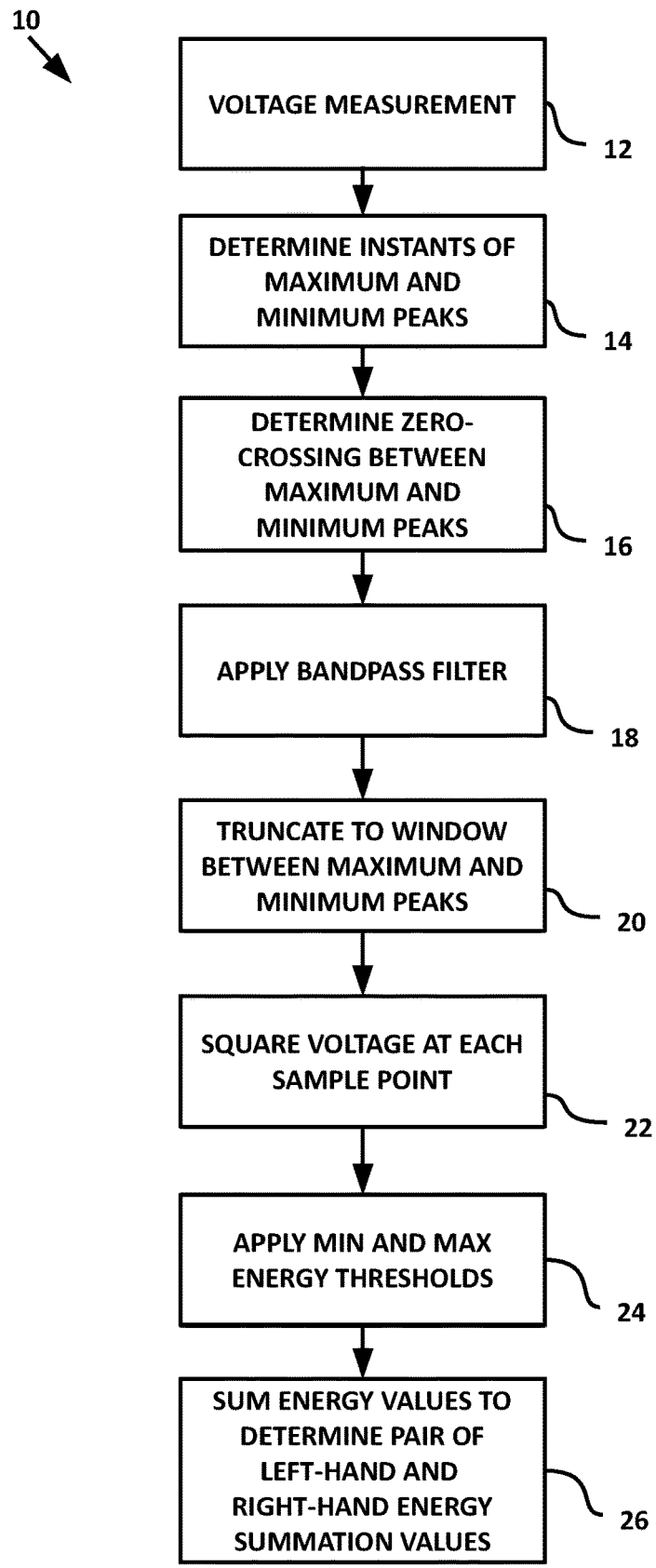
FIG. 2 is a flow chart of a subprocess of the arc fault detection algorithm shown in FIG. 1.
Figure 3:
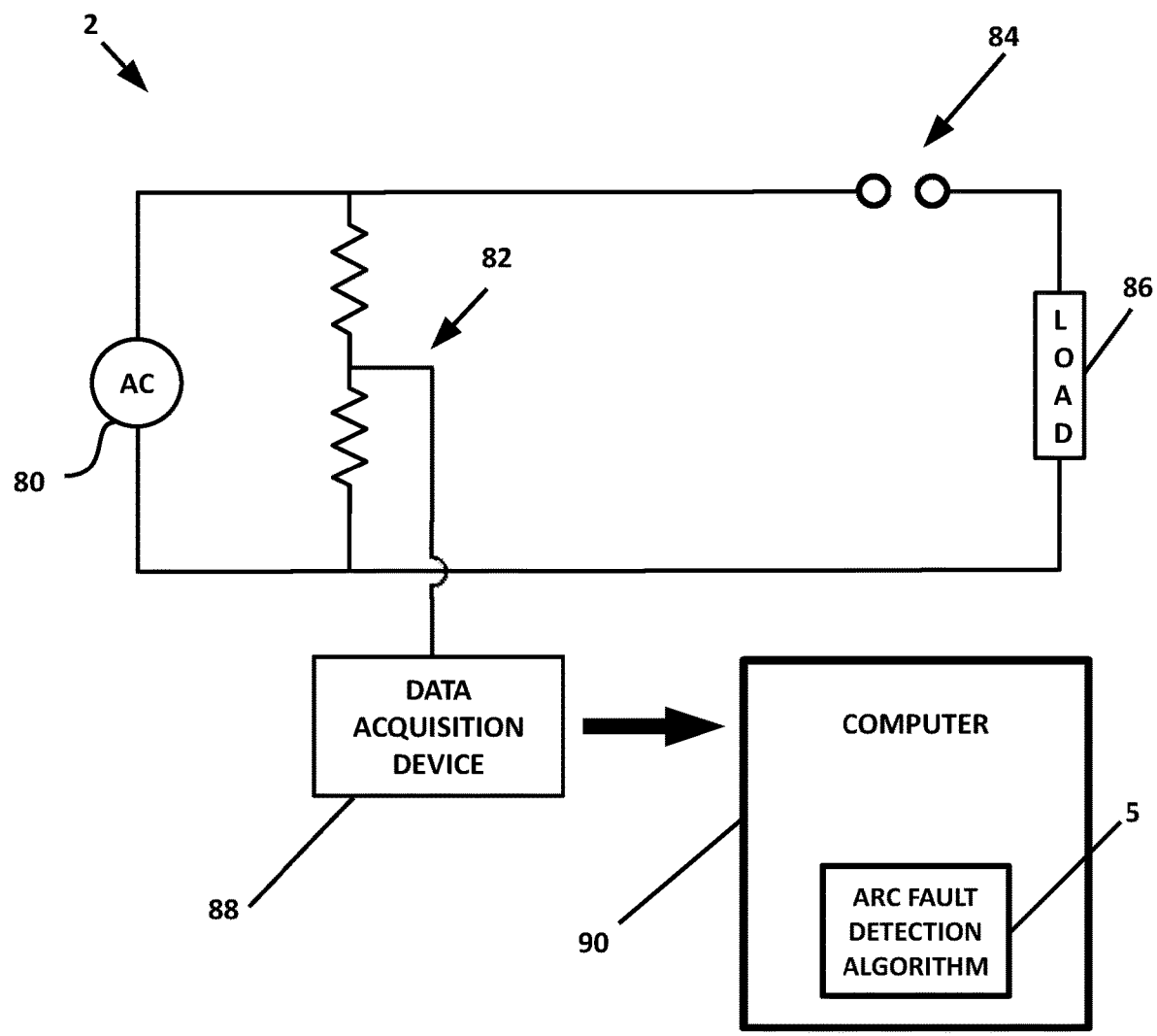
FIG. 3 illustrates an example circuit where an arc fault is detected using the arc fault detection algorithm of FIG. 1.
Figure 4:
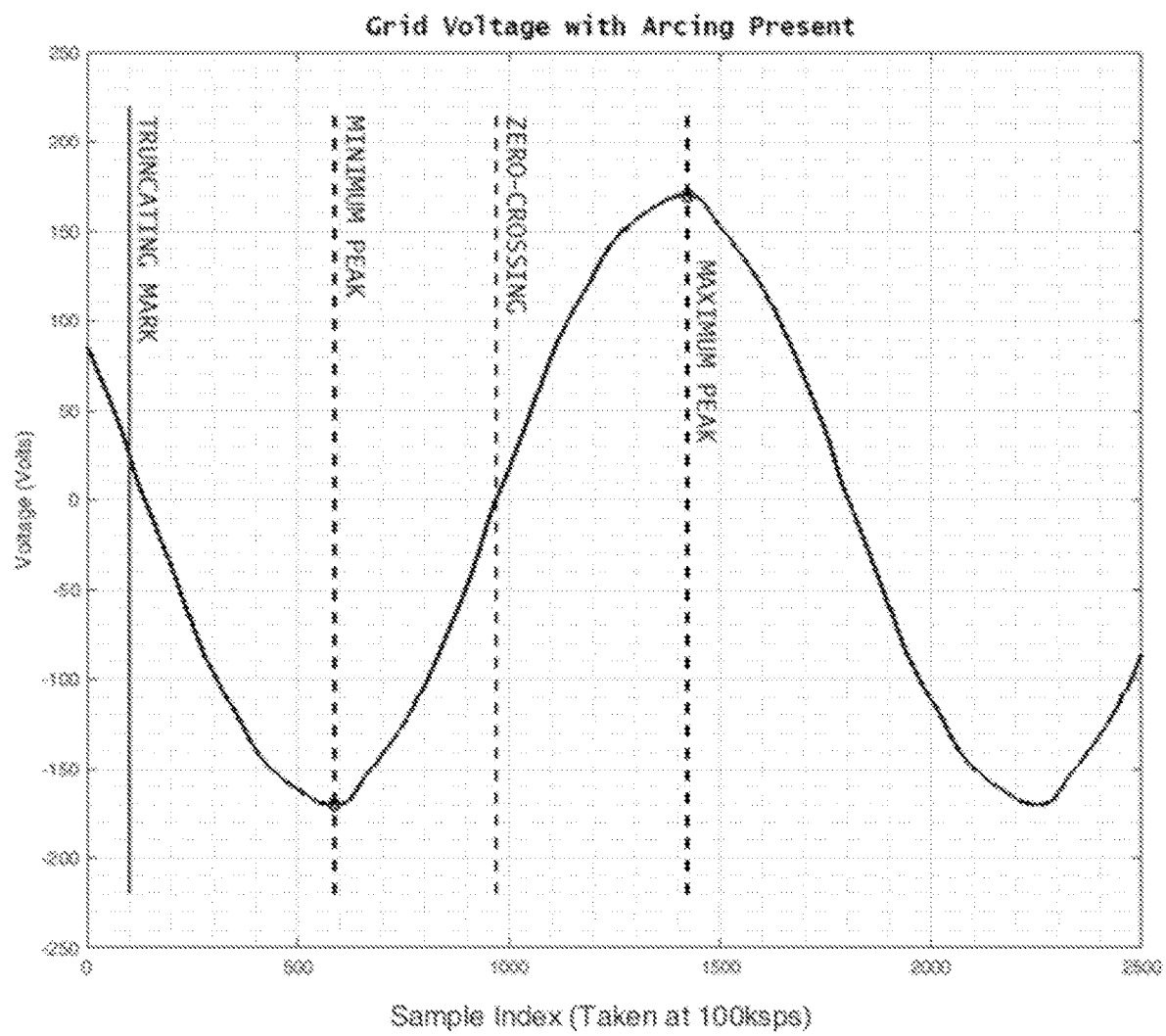
FIG. 4 shows a captured grid voltage signal with arcing present.

Referring now to the drawings wherein the showings are for the purposes of illustrating an embodiment of the invention only and not for the purposes of limiting same, FIG. 1 is a flow chart of an arc fault detection algorithm 5, according to an embodiment of the present invention; FIG. 2 is a flow chart of a subprocess of arc fault detection algorithm 5, and FIG. 3 illustrates an example circuit 2 where an arc fault is detected using arc fault detection algorithm 5. Circuit 2 is comprised of an AC power supply 80, a voltage divider 82, an air gap 84, and a load 86.

Computer 90 is programmed to operate in accordance with arc fault detection algorithm 5 described in detail below. Voltage data is acquired by computer 90 using a data acquisition device 88 (e.g., National Instrument's Multifunction DAQ for USB—model no. NI USB-6221).

Referring now to FIG. 1, step 10 of algorithm 5 is data acquisition and preparation of an energy waveform. The details of step 10 will now be described with reference to the subprocess shown in FIG. 2 and the waveforms shown in FIGS. 4-7.

A window of one voltage cycle is measured (step 12), and the time instant of maximum and minimum peaks of the voltage waveform (preferably after the first millisecond) is determined (step 14). It is advantageous to omit the first millisecond of the window from consideration because when this signal is filtered (as described below) ringing will occur in this time period.

In the illustrated embodiment, one and a half cycles of the grid voltage is captured to obtain the one voltage cycle. The "truncating mark" shown in FIG. 4 reduces the window of interest, since the data points before the truncating mark will be contaminated with noise from the digital filter. The arcing signatures are analyzed between the minimum and maximum peaks, as will be described in detail below.

At step 16, a zero-crossing between the maximum and minimum peaks (which denotes an axis of symmetry) is determined. The zero-crossing marker denotes the axis of symmetry that divides the left-hand and right-hand sides. Steps 12-16 are illustrated by the waveform shown in FIG. 4.

Figure 5:
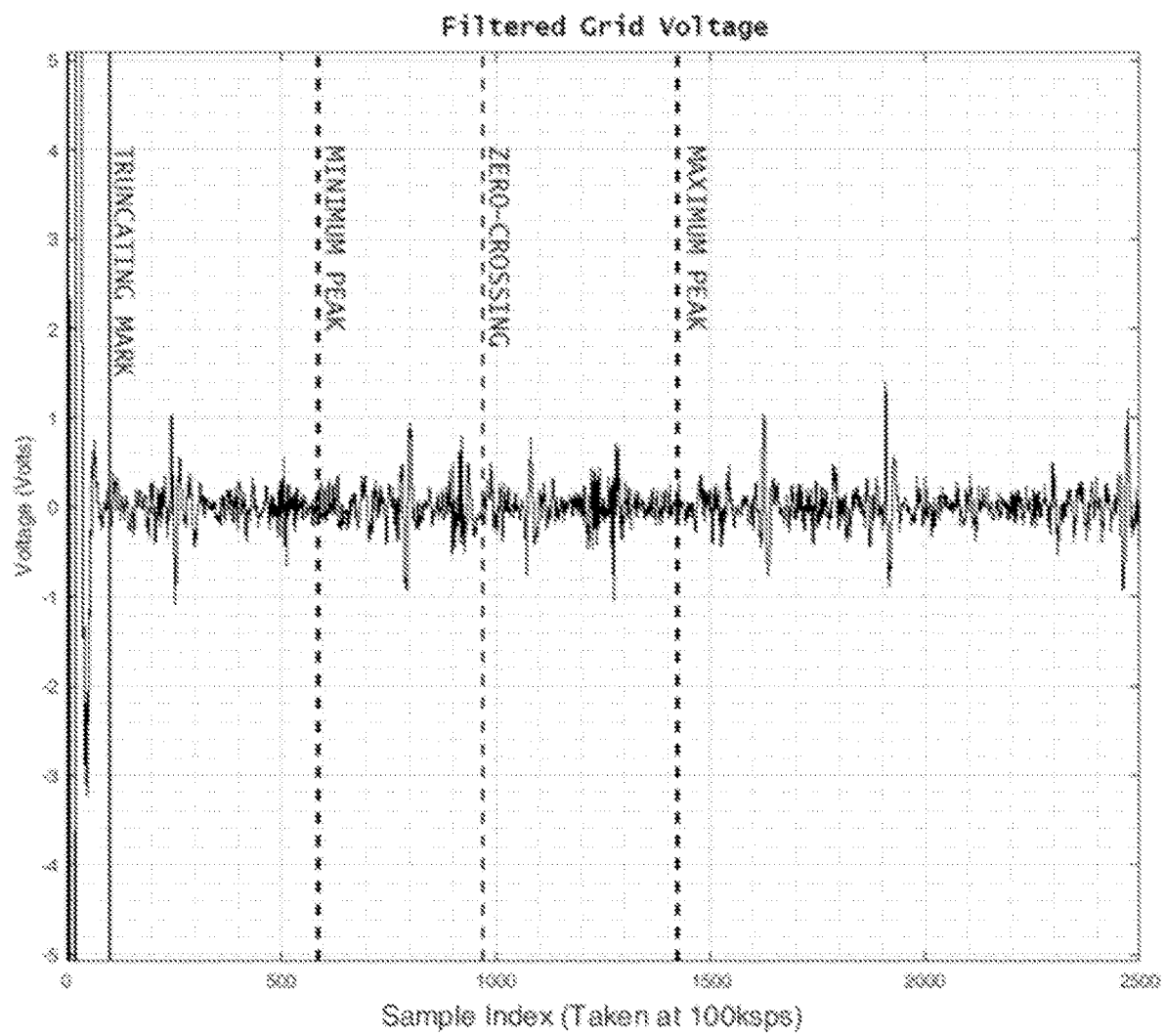
FIG. 5 shows the voltage signal of FIG. 4 after digital filtering.

Next, a bandpass filter is applied to the entire voltage window (step 18), as shown in FIG. 5. Accordingly, the captured grid voltage is digitally filtered. The markers for the minimum and maximum peak hold the analysis area of interest. The zero-crossing marker holds the position of the zero-crossing from the unfiltered voltage signal. Large peaks created by the digital filtering process are seen before the truncating mark and are not considered in the analysis described in detail below.

Figure 6:
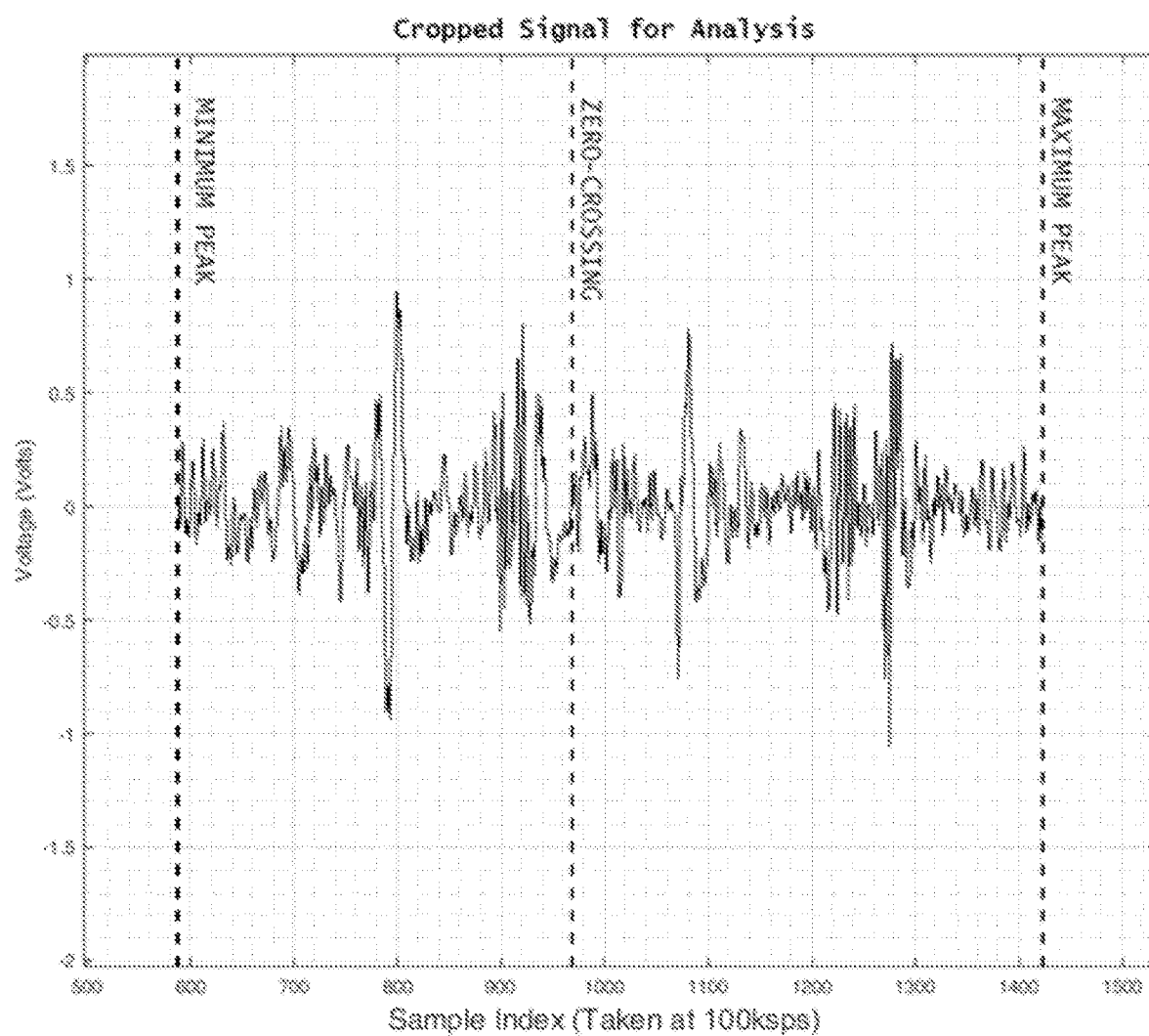
FIG. 6 shows the digitally filtered signal of FIG. 5 after cropping.

At step 18, the filtered window is truncated to between the instant between maximum and minimum peaks of the voltage waveform before the filtering, as shown in FIG. 6. Accordingly, the digitally filtered signal is cropped so that only data between the minimum and maximum peak markers are analyzed.

Figure 7:
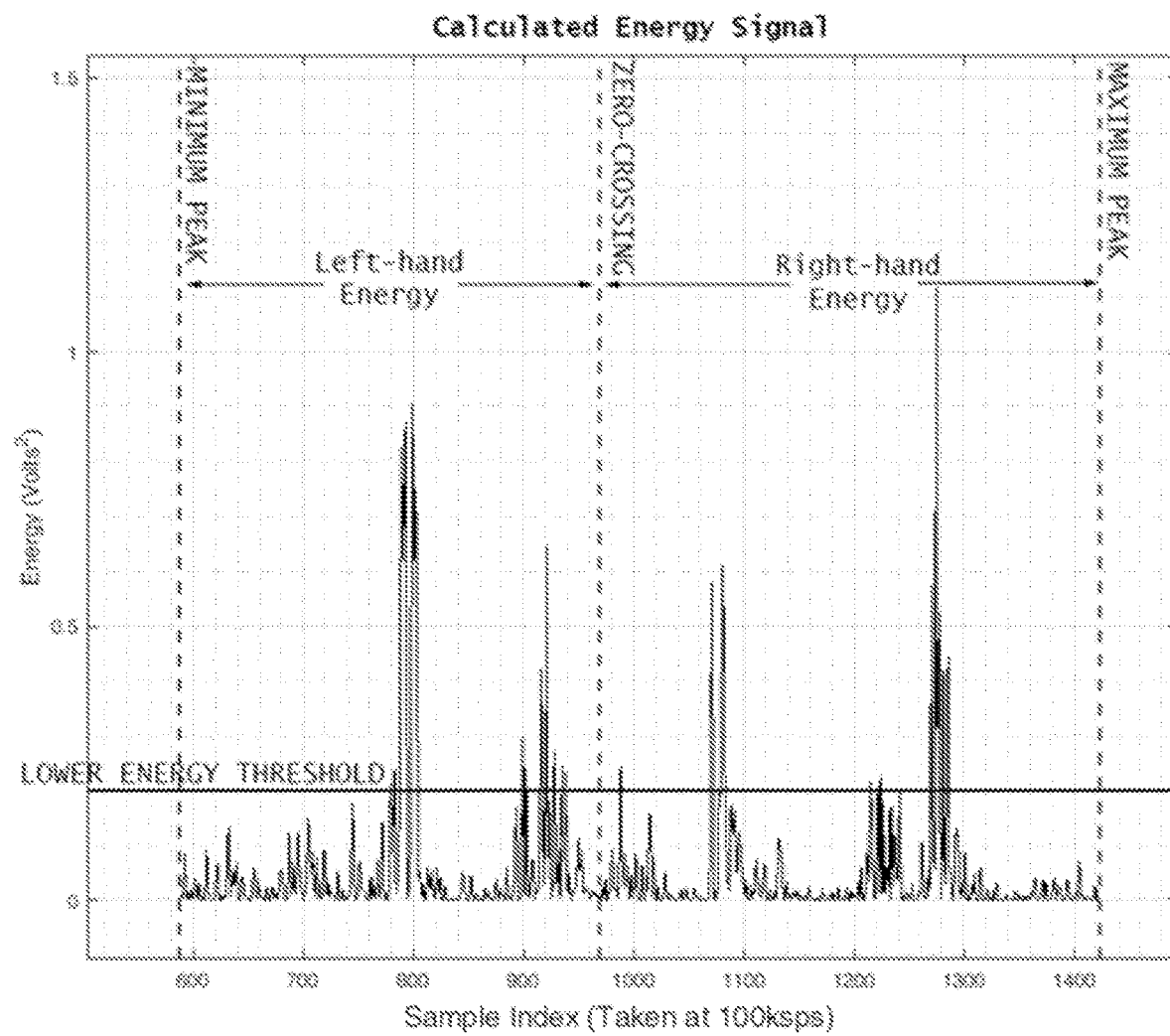
FIG. 7 shows an energy waveform obtained by squaring the cropped voltage signal of FIG. 6.

Next, the voltage is squared at each sample point (step 22) to obtain $V^2$ energy values, thereby providing the resulting energy waveform shown in FIG. 7. Accordingly, the cropped voltage signal shown in FIG. 6 is squared to generate the energy waveform of FIG. 7. Both left-hand energy and right-and energy are shown in the calculated energy waveform of FIG. 7.

At step 24, a lower energy threshold and an upper energy threshold are applied. The lower and upper energy thresholds are predetermined based on a pure grid voltage signal with no arcing. In the illustrated example, the upper energy threshold is outside the bounds of the plot shown in FIG. 7.

At step 26, the left-hand energy values (i.e., the energy values to the left of the zero-crossing) and the right-hand energy values (i.e., the energy values to the right of the zero-crossing), between the lower and upper thresholds, are respectively summed to obtain two (2) energy points (i.e., a left-hand energy summation value and a right-hand energy summation value). Data acquisition and preparation step 10 shown in FIG. 2 is repeated as a subprocess to obtain a plurality of sets of energy points for algorithm 5, as will be described below. For example, data may be acquired during a sampling period t. In the embodiment illustrated herein, the sampling period t is 12.5 seconds. However, it is contemplated that the sampling period may be a continuous period of time to thereby continuously monitor a circuit for detection of an AC arc fault.

Returning now to FIG. 1, there is shown three (3) different processes (steps 30-38, 40-48, and 50-58) respectively associated with evaluation of left-hand energy summation (steps 30-38), right-hand energy summation (steps 40-48), and total energy summation (steps 50-58). The total energy summation refers to summation of both the left-hand energy value and the right-hand energy value.

With reference to step 30, the left-hand energy summation value is obtained from step 10. At step 32, a differential left-hand summation energy value is determined by subtracting the current left-hand summation energy value from the prior left-hand summation energy value (i.e., the left-hand summation energy value obtained during the prior iteration of step 10). Similarly, at step 40, the right-hand energy summation value is obtained from step 10. At step 42, a differential right-hand summation energy value is determined by subtracting the current right-hand summation energy value from the prior right-hand summation energy value (i.e., the right-hand summation energy value obtained during the prior iteration of step 10). At step 50, a total energy summation value is obtained by summing the left-hand summation value and the right-hand energy summation value.

Figure 8:
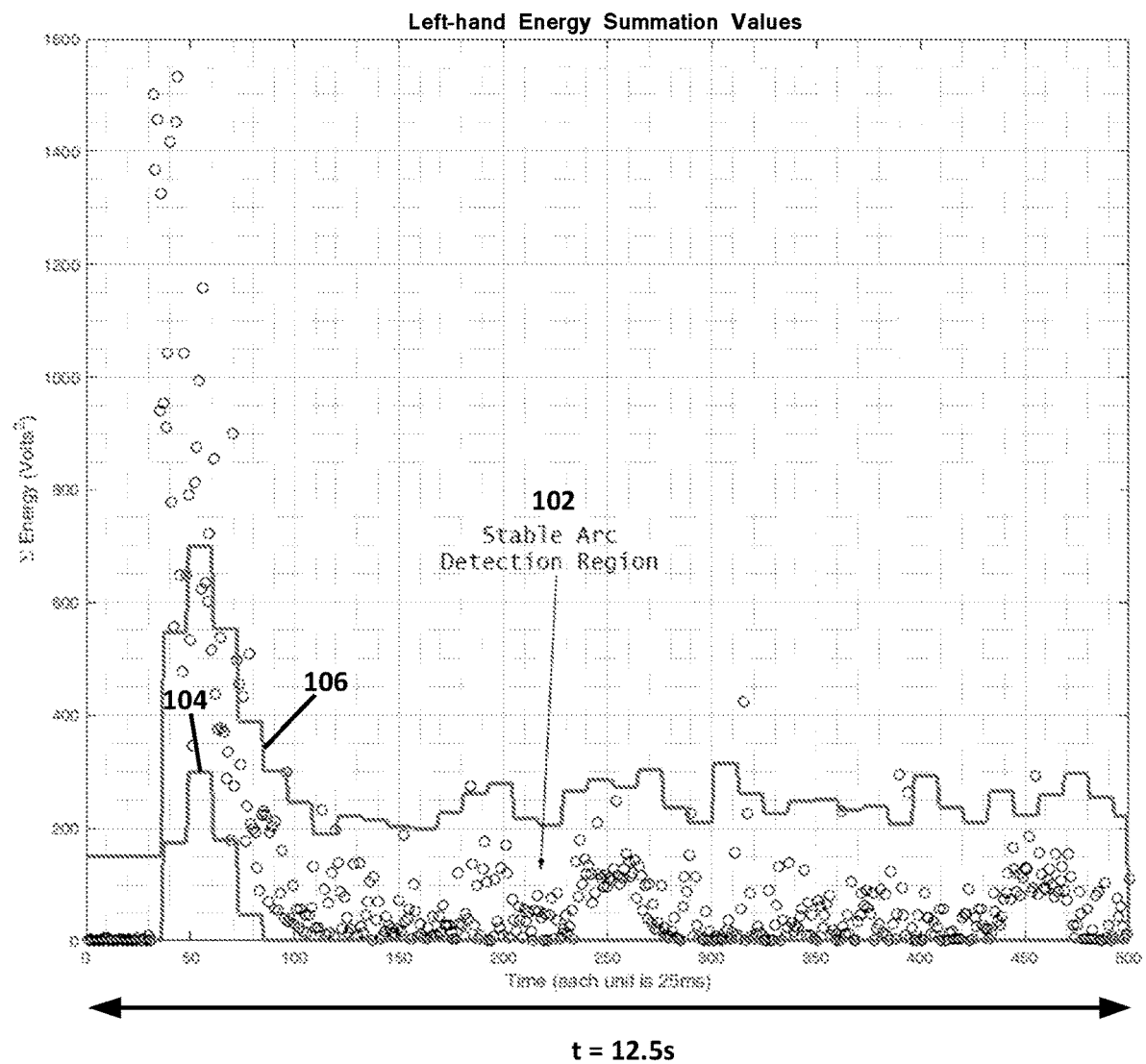
FIG. 8 shows a plot of left-hand energy summation values.
Figure 9:
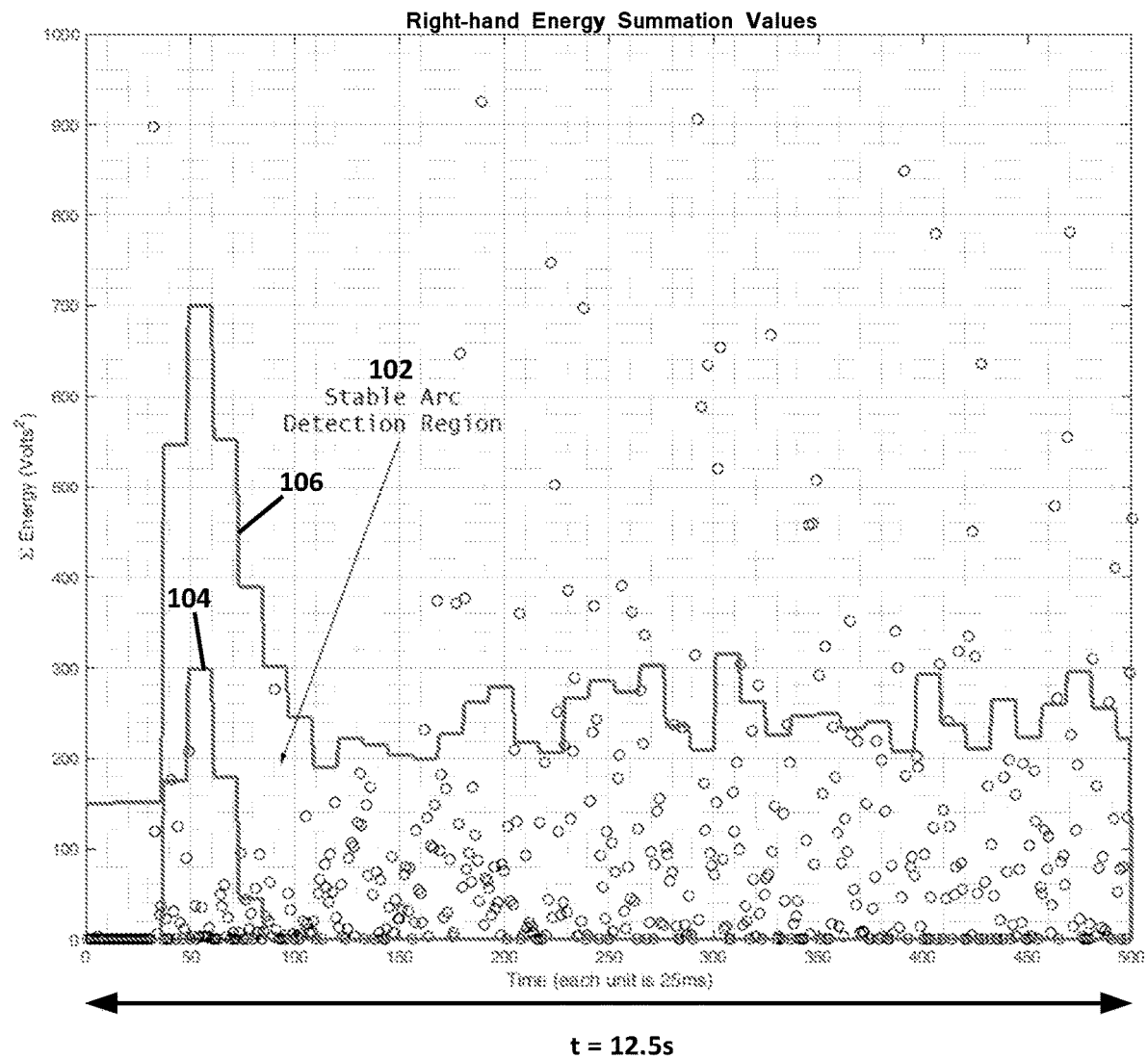
FIG. 9 shows a plot of right-hand energy summation values.
Figure 10:
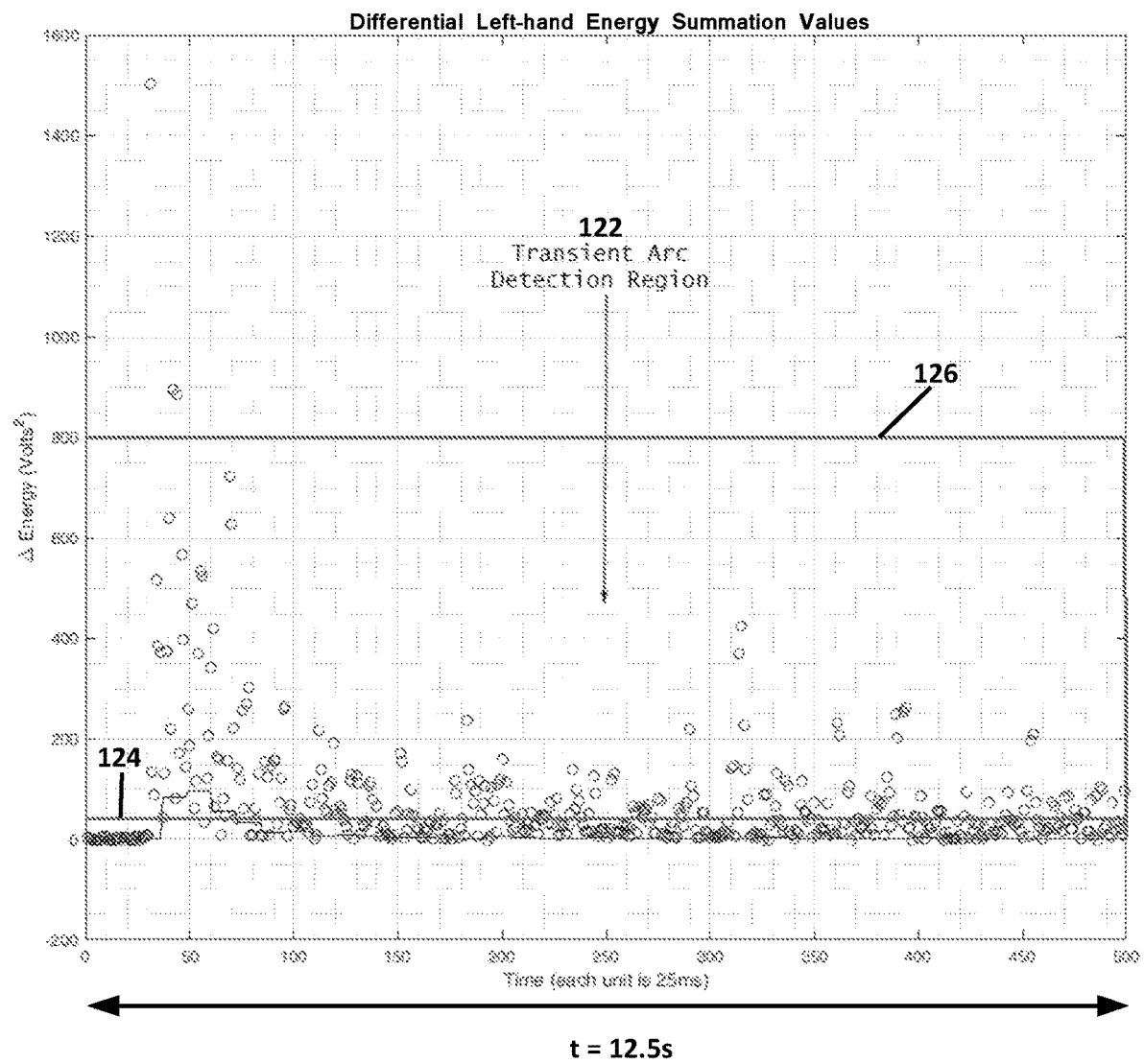
FIG. 10 shows a plot of differential left-hand energy summation values.
Figure 11:
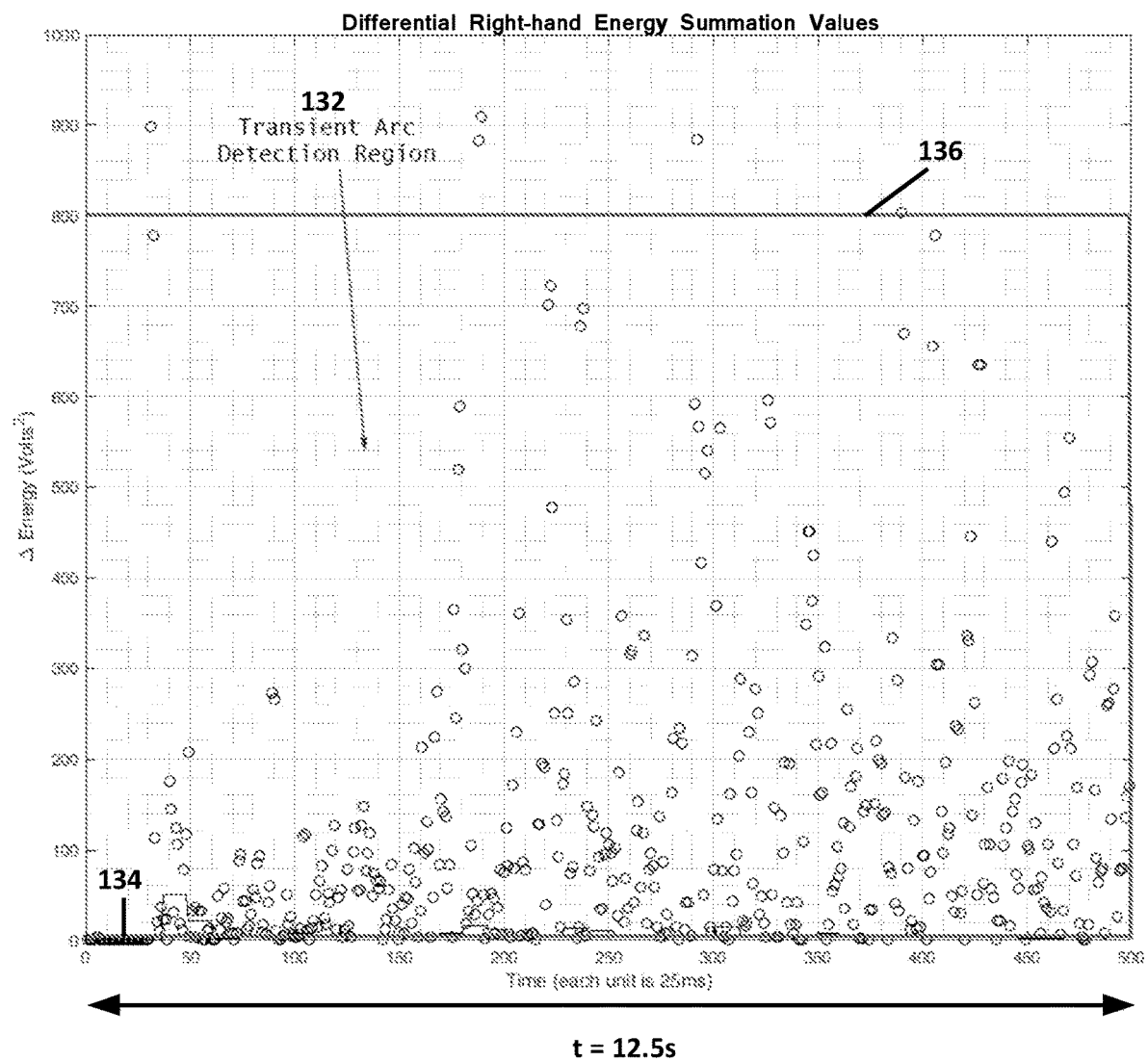
FIG. 11 shows a plot of differential right-hand energy summation values.

As will be discussed in further detail below, data acquisition step 10 is repeated in accordance with algorithm 5. Thus, a plurality of left-hand energy summation values (step 30), a plurality of right-hand energy summation values (step 40), and a plurality of total energy summation values (step 50) are obtained. FIG. 8 shows a plurality of left-hand energy summation values obtained at step 30 during the sampling period t. Likewise, FIG. 9 shows a plurality of right-hand energy summation values obtained at step 40 during the sampling period t. The total energy summation values are the sum of the left-hand energy and right-hand energy summation values. FIG. 10 shows a plurality of differential left-hand summation energy values obtained at step 32 during the sampling period t. The plot shown in FIG. 10 emphasizes changes in the energy summation values with time. Likewise, a plurality of differential right-hand summation of energy values obtained at step 42 during the sampling period t are shown in FIG. 11.

Referring now to steps 34, 44, and 54, it is determined whether, as a result of repeating step 10 according to algorithm 5, a sufficient number of energy summation values (i.e., left-hand energy summation values, right-hand energy summation values, and total energy summation values) have currently been obtained such that average energy summation values can be determined. If a sufficient number of energy summation values have been obtained, then average values are determined for the left-hand energy summation values, the right-hand summation values, and the total energy summation values (steps 36, 46, and 56). These average energy summation values are used to determine arc-tracking boundaries, as which will now be described in detail.

Arc-tracking boundaries for a stable arc detection region (associated with the left-hand and right-hand energy summation values) and a transit arc detection region (associated with differential left-hand and differential right-hand energy summation values) are determined based on the respective average energy summation values (steps 38, 48, and 58). It should be noted that the boundaries for stable arc detection region for both the left-hand and right-hand energy summation values are the same.

The calculations for determining (lower and upper) boundaries for establishing the stable arc detection region will now be described in detail. In accordance with an embodiment of the present invention, the stable arc detection region boundaries are calculated according to the following expression:

$$SA_{arc} = V^2_{avg} \pm (V^2_{avg} * X_{SA} + Y_{SA})$$

where:
$SA_{arc}$ is a value indicative of the upper and lower boundaries of the stable arc detection region;
$V^2_{avg}$ is the arithmetic average of a group of consecutive left-hand and right-hand energy summation values; and
$X_{SA}$ & $Y_{SA}$ are constant scaling and offset values, respectively, determined empirically in advance.

In accordance with an embodiment of the present invention, the upper and lower boundaries are calculated each time there are a sufficient number of new energy summation values to take another average.

FIGS. 8 and 9 show the stable arc detection region 102 defined by lower boundary 104 and upper boundary 106. The boundaries in the plot have reached their lower and upper limits which are constants determined in advance based on energy values due to sudden surges (i.e., switching loads) and normal operations (a baseline energy in the system) characterized specifically to energy on the left-hand side of the zero-crossing.

The determination of boundaries for establishing the transient arc detection region for the differential left-hand energy summation values will now be described in detail. It should be noted that the determination of the boundaries for establishing the transient arc detection region for the differential right-hand energy summation values is substantially the same, however, values for differential right-hand energy summation values are substituted for differential left-hand energy summation values.

In accordance with an embodiment of the present invention, the transient arc detection region boundaries for the differential left-hand energy summation values are calculated according to the following expression:

$$TA_{Larc} = \mu V^2_{Lavg} \pm (\Delta V^2_{Lavg} * X_{LTA} + Y_{LTA})$$

where:
$TA_{Larc}$ is a value indicative of the upper and lower left-hand boundaries of the transient arc detection region;
$\Delta V^2_{Lavg}$ is the average of a group of consecutive differential left-hand energy summation values; and
$X_{LTA}$ & $Y_{LTA}$ are constant scaling and offset factors, respectively, determined empirically in advance.

The upper and lower boundaries are calculated every time there are a sufficient number of new energy summation values to take another average.

FIG. 10 shows transient arc detection region 122, defined by lower boundary 124 and upper boundary 126, for the differential left-hand energy summation values. The boundaries in the plot have reached their lower and upper limits which are constants determined in advance based on energy values due to sudden surges (i.e., switching loads) and normal operations (a baseline energy in the system) characterized specifically to energy on the left-hand side of the zero-crossing.

FIG. 11, shows transient arc detection region 132, defined by lower boundary 134 and upper boundary 136, for the differential right-hand energy summation values.

In accordance with an embodiment of the present invention, predetermined minimum and maximum limit values may be established for the upper and lower boundaries defining the transient arc detection region. In the illustrated embodiment shown in FIGS. 10 and 11, the calculated value for the lower boundary are less than the minimum limit value. Accordingly, lower boundaries 124 and 134 are set to the minimum limit value. Likewise, the calculated value for the upper boundary are more than the maximum limit value. Accordingly, upper boundaries 126 and 136 are set to the maximum limit value.

At step 62, if both the differential left-hand energy summation value (FIG. 10) and corresponding differential right-hand energy summation value (FIG. 11) simultaneously remain inside their respective transient arc detection boundaries, then it is determined that a potential arcing signature has been detected and a potential arc flag is set (step 70). Similarly, at step 64, if both the left-hand energy summation value (FIG. 8) and right-hand energy summation value (FIG. 9) are simultaneously within the stable arc detection boundaries, then a potential arcing signature has been detected and a potential arc flag is set (step 70). At step 72, it is determined whether a predetermined number of consecutive potential arc flags have been set. If the predetermined number of consecutive potential arc flags have been set, then an arc fault is detected (step 74).

Figure 12:
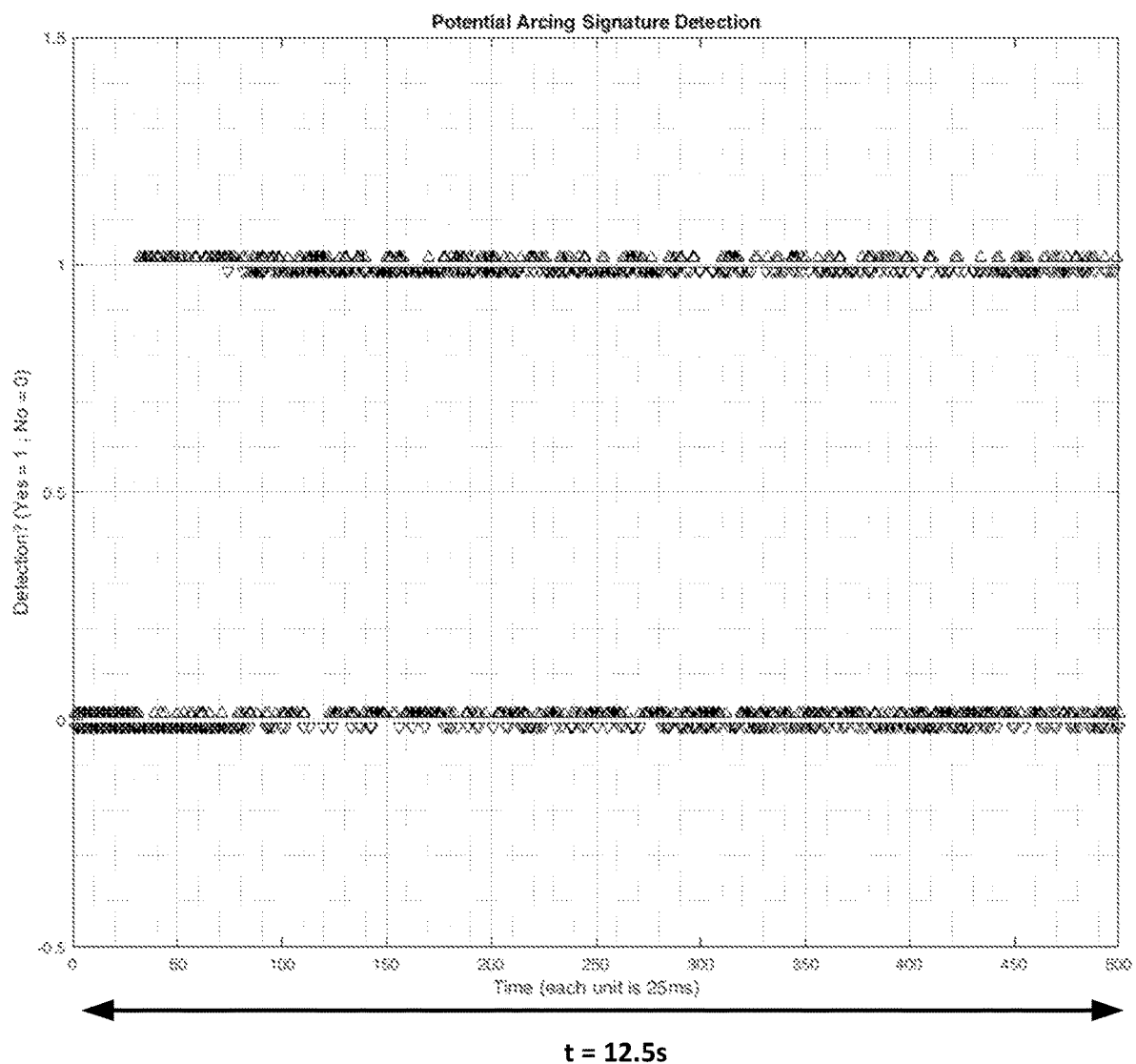
FIG. 12 shows a plot of flags indicative of potential stable and transient arc activity.
Figure 13:
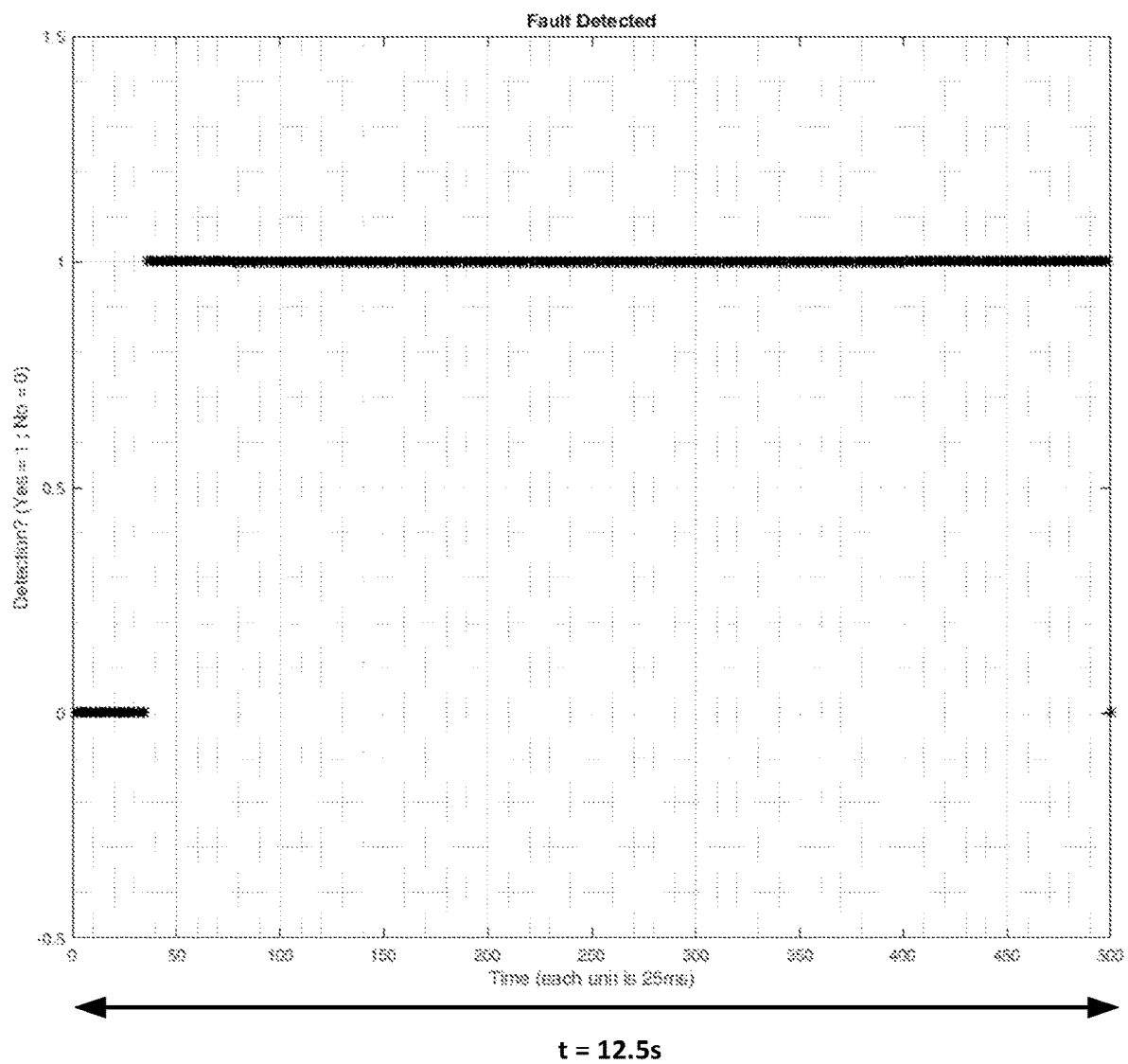
FIG. 13 shows an output of a fault detection signal indicative of the presence/absence of an arc fault according to an embodiment of the present invention.

Referring now to FIG. 12, when a potential arcing signature is detected, a flag is set to keep track of all potential arcs. The downward pointing triangle is indicative of stable arc activity (step 64), while the upward pointing triangle is indicative of transient arc activity (step 62).

In the illustrated example embodiment of the present invention, the predetermined number of consecutive potential arc flags for detection of an arc fault is set for five (5) flags. Accordingly, when five (5) consecutive potential arcing signatures are detected, algorithm 5 determines that an arc fault has occurred (step 74). It should be appreciated that the predetermined number of consecutive flags that need to be set to detect an arc fault can set to other values in accordance with the present invention.

If multiple consecutive flags have not been detected at step 72, then algorithm 5 is repeated by returning to step 10 to acquire another set of energy summation values.

In response to detection of an arc fault at step 74, an arc flag detection signal may be activated. A visual warning or other indicator may be activated in response to activation of this arc flag detection signal.

In the given example, an arc was generated at 800 ms (on the x-axis in the graph it is tick 32). An arc fault was determined by algorithm 5 at 900 ms (on the x-axis in the graph it is tick 36). Accordingly, the time required for an arc fault detection was 100 ms for a system with 120 Vrms 60 Hz AC signal with an approximate load of 10.2 A.

The foregoing describes specific embodiments of the present invention. It should be appreciated that these embodiments are described for purposes of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. A method for detecting arc faults in an AC circuit using arc fault detection circuitry communicatively coupled to a data acquisition device, the data acquisition device including a voltage measurement device, comprising:
    (a) measuring via the data acquisition device an AC voltage signal of the AC circuit to obtain one cycle of the AC voltage signal, and providing the measured AC voltage signal to the arc fault detection circuitry;
    (b) obtaining by the arc fault detection circuitry a left-hand energy summation value and a right-hand energy summation value from the measured AC voltage signal, wherein the left-hand energy summation value is determined by summing left-hand energy values left of a zero-crossing and the right-hand energy summation value is determined by summing right-hand energy values right of the zero-crossing;
    (c) obtaining by the arc fault detection circuitry a differential left-hand energy summation value and a differential right-hand energy summation value, wherein the differential left-hand energy summation value and differential right-hand energy summation value respectively indicate changes in the left-hand energy summation value and the right-hand energy summation value;
    (d) obtaining by the arc fault detection circuitry a total energy summation value for use in generating stable arc boundaries, wherein the total energy summation value is a sum of the left-hand energy summation value and the right-hand energy summation value;
    (e) determining by the arc fault detection circuitry whether both the differential left-hand energy summation value and the differential right-hand energy summation value are simultaneously inside their respective transient arc boundaries, wherein if both the differential left-hand energy summation value and the differential right-hand energy summation value are simultaneously inside their respective transient arc boundaries, then setting a potential arc flag;
    (f) determining by the arc fault detection circuitry whether both the left-hand energy summation value and the right-hand energy summation value are simultaneously inside a stable arc boundary, wherein if both the left-hand energy summation value and the right-hand energy summation value are simultaneously inside the stable arc boundary, then setting the potential arc flag;
    (g) detecting by the arc fault detection circuitry an arc fault if a predetermined number of consecutive potential arc flags are set; and
    (h) repeating steps (a) through (g) a plurality of times to monitor for arc faults.

2. The method according to claim 1, wherein the step of obtaining the plurality of left-hand energy summation values and the plurality of right-hand energy summation values includes:
    determining maximum and minimum peaks in the one cycle of the AC voltage signal;
    determining the zero-crossing between the maximum and minimum peaks of the one cycle of the AC voltage signal;
    applying a band pass filter to the one cycle of the AC voltage signal;
    truncating the one cycle of the AC voltage signal to a window between the maximum and the minimum peaks;
    squaring voltage values of the one cycle of the AC voltage signal to obtain squared voltage values indicative of energy values;
    applying minimum and maximum energy thresholds to the energy values; and
    summing the energy values to the left of the zero-crossing within the minimum and maximum energy thresholds to determine the left-hand energy summation value and summing the energy values to the right of the zero-crossing within the minimum and maximum energy thresholds to determine the right-hand energy summation value.

3. The method according to claim 1, wherein the stable arc boundary is determined using an arithmetic average of a group of consecutive left-hand and right-hand energy summation values.

4. The method according to claim 1, wherein the transient arc detection boundary for the differential left-hand energy summation value is determined using an average of a group of consecutive differential left-hand energy summation values.

5. The method according to claim 1, wherein the transient arc detection boundary for the differential right-hand energy summation value is determined using an average of a group of consecutive differential right-hand energy summation values.

6. The method according to claim 1, wherein the predetermined number of consecutive potential arc flags is at least 5.

7. The method according to claim 1, wherein said transient arc boundaries and said stable arc boundary are re-calculated periodically.

* * * * *